US006909312B2

(12) United States Patent
Mitsumoto

(10) Patent No.: US 6,909,312 B2
(45) Date of Patent: Jun. 21, 2005

(54) SYNCHRONIZATION CIRCUIT AND SYNCHRONIZATION METHOD

(75) Inventor: Kinya Mitsumoto, Tamamura (JP)

(73) Assignee: Renesas Technology Corp., Tokyo (JP)

(*) Notice: Subject to any disclaimer, the term of this patent is extended or adjusted under 35 U.S.C. 154(b) by 0 days.

(21) Appl. No.: 10/766,945

(22) Filed: Jan. 30, 2004

(65) Prior Publication Data
US 2004/0222831 A1 Nov. 11, 2004

(30) Foreign Application Priority Data

Jan. 31, 2003 (JP) ....................................... 2003-023017

(51) Int. Cl.[7] .............................................. H03L 7/00
(52) U.S. Cl. ...................................... 327/141; 327/158
(58) Field of Search ................................. 327/141, 147, 327/149, 152–153, 156, 158, 161

(56) References Cited

U.S. PATENT DOCUMENTS

| | | | | |
|---|---|---|---|---|
| 5,883,534 A | * | 3/1999 | Kondoh et al. | 327/156 |
| 5,969,552 A | * | 10/1999 | Lee et al. | 327/158 |
| 6,052,004 A | | 4/2000 | Saeki | 327/116 |
| 6,066,968 A | * | 5/2000 | Yang | 327/156 |
| 6,172,537 B1 | * | 1/2001 | Kanou et al. | 327/99 |
| 6,388,945 B2 | * | 5/2002 | Aikawa | 365/233 |
| 6,509,763 B2 | * | 1/2003 | Taguchi et al. | 327/58 |
| 6,593,786 B2 | * | 7/2003 | Jung | 327/158 |
| 6,677,792 B2 | * | 1/2004 | Kwak | 327/158 |
| 6,774,689 B1 | * | 8/2004 | Sudjian | 327/158 |

FOREIGN PATENT DOCUMENTS

| | | | | |
|---|---|---|---|---|
| JP | 8-307254 | | 11/1996 | ........... H03L/7/107 |
| JP | 11-4145 | | 1/1999 | ............ H03K/5/00 |

* cited by examiner

Primary Examiner—Timothy P. Callahan
Assistant Examiner—Cassandra Cox
(74) Attorney, Agent, or Firm—Antonelli, Terry, Stout & Kraus, LLP

(57) ABSTRACT

Phase synchronization is achieved by forming a first pulse to be synchronized with a reference pulse, a second pulse leading in phase for a certain period relative to said first pulse and a third pulse delayed in phase for a certain period from said first pulse; comparing said reference pulse with said first pulse in a first comparing; comparing said reference pulse with said second pulse and said third pulse in a second comparing; and forming a control voltage by giving priority to a comparison output of said second comparing with respect to a comparison output of said first comparing, matching the phase of said reference pulse with the phrase of said second pulse or said third pulse, and matching, after said matching of phases, the phrase of said reference pulse with the phase of said first pulse by forming said control, voltage from the comparison output of said first comparing.

9 Claims, 15 Drawing Sheets

UP COARSE ADJUSTMENT

DOWN COARSE ADJUSTMENT

UP FINE ADJUSTMENT

DOWN FINE ADJUSTMENT

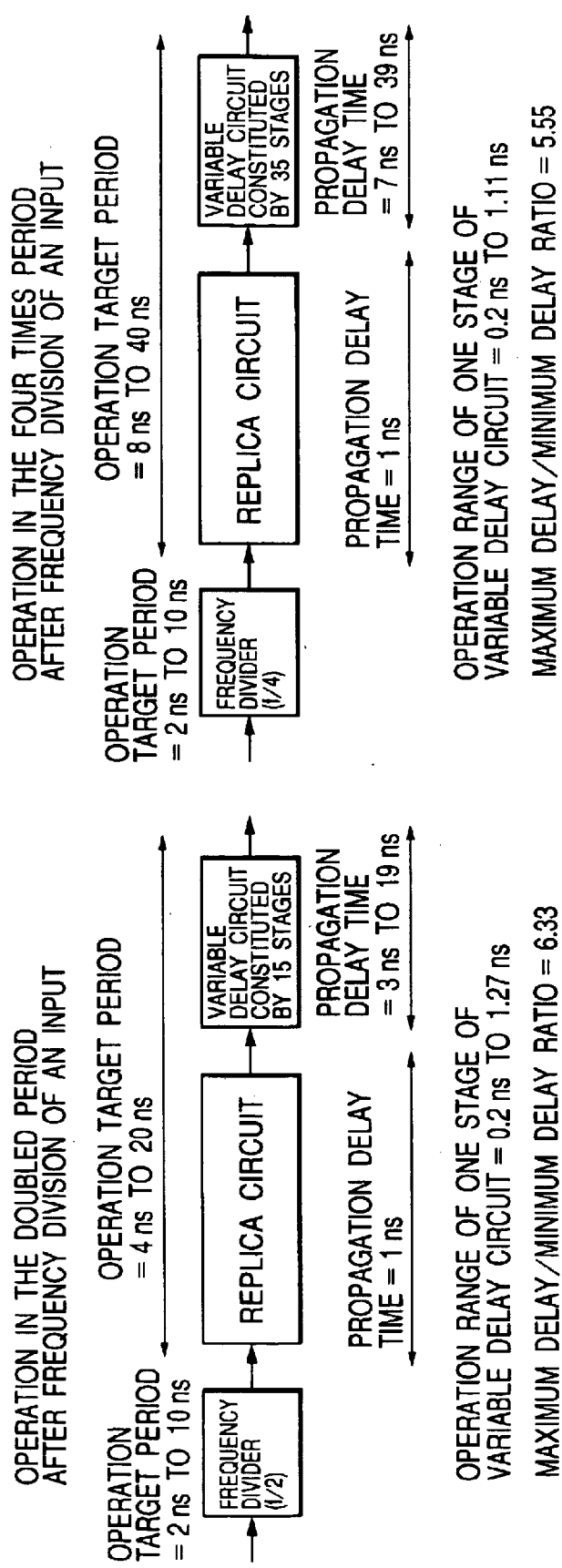

EXAMPLE OF STRUCTURE OF VARIABLE DELAY CIRCUIT 2
(IN THE CASE OF 1/4 FREQUENCY DIVISION)

SYNCHRONIZATION CIRCUIT AND SYNCHRONIZATION METHOD

BACKGROUND OF THE INVENTION

The present invention relates to a synchronization circuit and a synchronization method and the technology, for example, which can be effectively utilized for the phase synchronization technology to be applied to a DLL (or PLL) circuit provided in semiconductor integrated circuit device.

An example of the PLL circuit which can continuously change over coarse adjustment and fine adjustment is disclosed in the Japanese Published Unexamined Patent Application No. Hei 08(1996)-307254. Moreover, an example of a frequency multiplying circuit including a combining circuit is disclosed in the Japanese Published Unexamined Patent Application No. 11(1999)-004145.

[Patent Document 1]

Japanese Published Unexamined Patent Application No. Hei 08(1996)-307254

[Patent Document 2]

Japanese Published Unexamined Patent Application No. Hei 11(1999)-004145

SUMMARY OF THE INVENTION

The technology described in the patent document 1 has the problem that tracking ability when the phase is deviated to a large extent is bad because the coarse adjustment and fine adjustment are performed based on the integration of phase comparison pulse.

The technology described in the patent document 2 is intended to multiply an input waveform and is moreover intended to input the multiplied signal to the PLL circuit. In the semiconductor integrated circuit device, operation frequency tends to become still higher. Therefore, even in the case of the synchronization circuit using a DLL circuit and a PLL circuit to be mounted into the semiconductor integrated circuit device, it is requested to obtain the stable synchronization signal which assures higher response characteristic and includes less amount of jitter. However, as is represented by the patent document 1, the response characteristic (tracking ability) and stability are in the opposite relationship. Moreover, here rises also a problem that when the frequency becomes higher, the signal waveform to be transferred is deformed and correct phase comparison becomes impossible.

An object of the present invention is to provide a synchronization circuit and a synchronization method in which both response characteristic and stability are satisfied with a simplified structure. Another object of the present invention is to provide a synchronization circuit and a synchronization method to obtain a synchronization signal which is stabilized for the frequency up to the higher frequency. The aforementioned and the other objects and novel features of the present invention will become apparent from the description of the present specification and the accompanying drawings.

The typical invention disclosed in the present invention will be briefly described below. In addition to a first pulse to be synchronized with the reference pulse, a second pulse which is leading in the phase for constant period to the first pulse and a third pulse which is delayed in the phase for constant period to the first pulse are formed by a first variable delay circuit, the first pulse is compared with the reference pulse by a first phase comparison circuit, the second pulse and third pulse are compared with the reference pulse by a second phase comparison circuit, a control voltage is formed by giving priority to a comparison output of the second phase comparison circuit for a comparison output of the first phase comparison circuit by a control voltage generating circuit which receives the comparison output of the first phase comparison circuit and the comparison output of the second phase comparison circuit, and after the phase of the reference pulse is matched with the phase of the second pulse or third pulse by the second phase comparison circuit, the control voltage is formed by the comparison output of the first phase comparison circuit in order to control delay time of the first variable delay circuit.

The other typical invention of the present invention will be briefly described below. The reference pulse is divided in the frequency with a frequency dividing circuit, a first pulse to be synchronized with the frequency-divided pulse is formed by the first variable delay circuit, the frequency-divided pulse is compared with the first pulse in the first phase comparison circuit, the reference pulse is divided in the frequency with the same dividing ratio as the frequency dividing circuit, multi-phase clocks corresponding to the frequency dividing ratio are formed on a frequency dividing/distributing circuit, the multi-phase clocks are respectively delayed by the second variable delay circuit formed by the frequency dividing/distributing circuit and formed in the identical structure to the first variable delay circuit, the control voltages of the first variable delay circuit and second variable delay circuit are formed by the control voltage generating circuit which receives a comparison output of the first phase comparison circuit, and a pulse corresponding to the reference pulse is generated by transferring a plurality of delay outputs due to the second variable delay circuit to a waveform shaping circuit.

BRIEF DESCRIPTION OF THE DRAWINGS

FIGS. 11(a) and 11(b) are diagrams for describing examples of measures for disappearance of pulse in FIG. 10 in relation to the present invention;

DETAILED DESCRIPTION OF THE PREFERRED EMBODIMENTS

Figure 1:
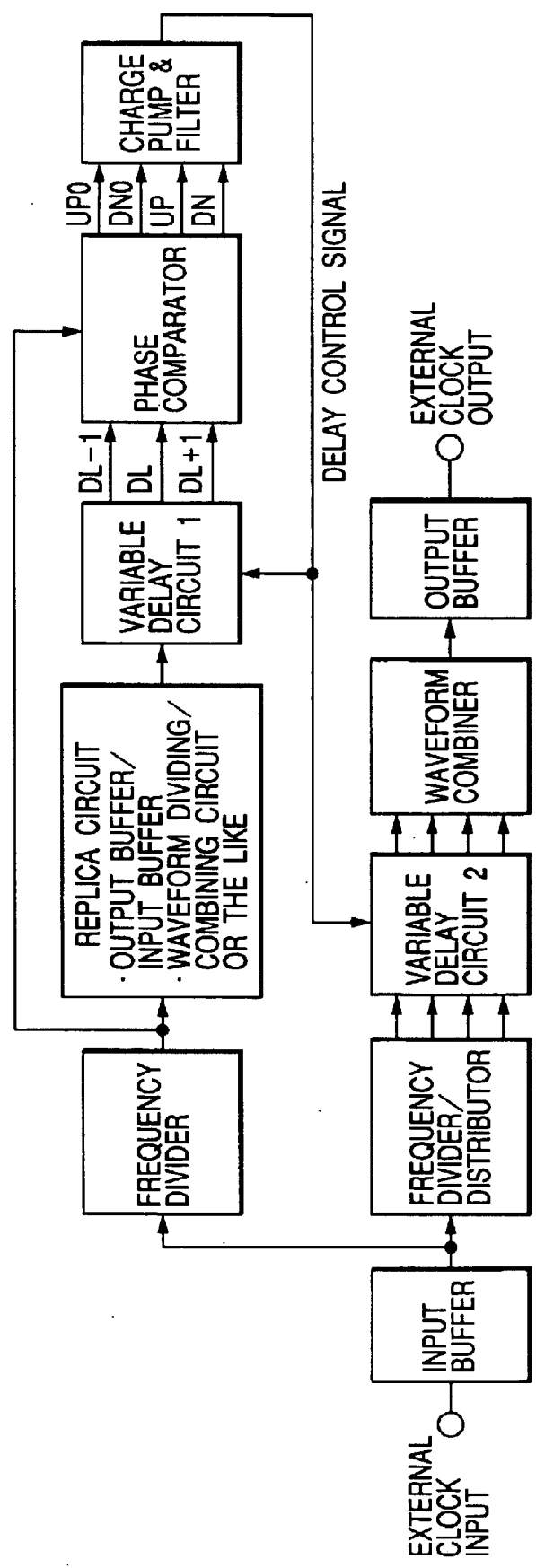
FIG. 1 is a block diagram illustrating an embodiment of a DLL circuit of the present invention.

FIG. 1 illustrates a block diagram of an embodiment of a DLL (Delay Locked Loop) of the present invention. The DLL circuit of this embodiment forms an external clock output synchronized with an external clock input and is constituted by a DLL section and a delay section to delay an external clock input. In this embodiment, various ideas are comprised to realize highly accurate phase control operation and delay operation in the frequency up to the still higher frequency band.

In this embodiment, the phase control is performed by clearly selecting coarse adjustment range and fine adjustment range in the DLL section. In more practical, a delay signal DL-1 in one preceding stage of the variable delay stage and a delay signal DL+1 in one subsequent stage thereof are formed for the standard delay signal DL in the variable delay circuit 1 of the DLL section. Namely, in the variable delay circuit 1, a unit variable delay stage is constituted by a plurality of stages, the standard delay signal DL which is delayed by one or a plurality of periods for the input pulse is formed, and the delay signal in one preceding stage of thee unit variable delay stage is DL-1, while the delay signal in one subsequent stage is DL+1.

In the DLL circuit of the present embodiment, although it will be described in more detail, signal frequency is lowered by a frequency divider in order to realize highly accurate phase control operation and delay operation in the frequency up to the higher frequency band, and this low frequency signal is inputted to the variable delay circuit 1 via a replica circuit. The standard delay signal DL, delay signals DL-1, DL+1 and the frequency-divided output from the frequency divider (input signal to the replica circuit) on the variable delay circuit 1 are compared in the phase comparator.

The phase comparator generates the phase comparison result UP/DN corresponding to the standard delay signal DL and the phase comparison result UP0/DN0 corresponding to the delay signals DL-1, DL+1. A charge pump & filter controls a delay time of the variable delay circuit 1 by receiving the phase comparison result and forming a delay control signal. Thereby, the phase of the output of the frequency divider is matched with the phase of the standard delay signal DL obtained by delaying this output. Namely, the phase of the input pulse inputted with the delay of one or a plurality of periods is matched with the phase of the standard delay signal DL.

The pulse inputted through an input buffer is frequency-divided with a frequency divider/distributor and is also distributed to a plurality of signals corresponding to the frequency dividing ratio, and these distributed signals are delayed by a variable delay circuit 2 of the structure which is identical to that of the variable delay circuit 1. This variable delay circuit 2 is constituted by a unit variable delay stage to form the standard delay signal DL of the variable delay circuit 1. A plurality of delay signals delayed by the variable delay circuit 2 are combined by a waveform combiner and converted to the pulse of the frequency which is identical to that of the original input pulse inputted through the input buffer, and finally outputted as an external clock output through an output buffer.

A replica circuit of the DLL circuit is constituted by a circuit which is identical to a waveform dividing/combining circuit or the like consisting of the output buffer, input buffer, frequency divider/distributor and waveform combiner in order to monitor delay of signal in these circuit elements. Since the variable delay circuit 1 forms a delay control signal, with inclusion of such signal delay, which is matched in the phase with the input pulse which is inputted with delay of one or a plurality of periods from the standard delay signal DL, the variable delay circuit 2 is also configured to provide the delay identical to that of the variable delay circuit 1. As a result, the external clock output can be outputted as the pulse synchronized with the external clock input.

When the external clock is inputted and it is then outputted as the external clock after the power amplification thereof in a semiconductor integrated circuit device, signal delay is generated in the input buffer section and output buffer section. Accordingly, when the external clock is outputted through the power amplification as described above, a delayed external clock is always formed. The signal delay in the input buffer and output buffer is compensated and the external clock output synchronized with the external clock input can be formed by utilizing the DLL circuit of this present embodiment.

In the DLL circuit of this embodiment, the signals DL, DL-1, DL+1 are formed by the variable delay circuit 1 and the phase control is performed by obviously separating the coarse adjustment range and fine adjustment range, in order to operate a coarse adjustment circuit when phase difference between the input pulse and DL exceeds the delay in one stage of the unit variable delay stage in the phase comparator and to execute the fine adjustment when such phase difference is within the delay of one stage of the unit variable delay stage. Thereby, both high-speed response characteristic and high stability can be attained to realize the phase control operation by setting a loop gain to the optimum value respectively corresponding to such coarse adjustment range and fine adjustment range.

The variable delay circuit 2 is usually configured identical to the variable delay circuit 1. In this case, there rises a problem that the control voltage given to the variable delay circuits 1, 2 for processing high frequency signal is unbalanced and thereby the signal can no longer be transmitted. In regard to avoidance of waveform disappearance in the variable delay circuit 1, disappearance of waveform is easily generated because the variable delay circuit 2 is required to delay the signal while the input signal period is maintained. In this embodiment, deformation or disappearance of waveform can be prevented by generating a multi-phase signal for lower operation period of the variable delay circuit 2 and then sending this multiphase signal to the variable delay circuit 2. Namely, the problem of such disappearance of waveform can be solved by recovering the signal of the original period from a plurality of signals with the waveform combiner.

Figure 2:
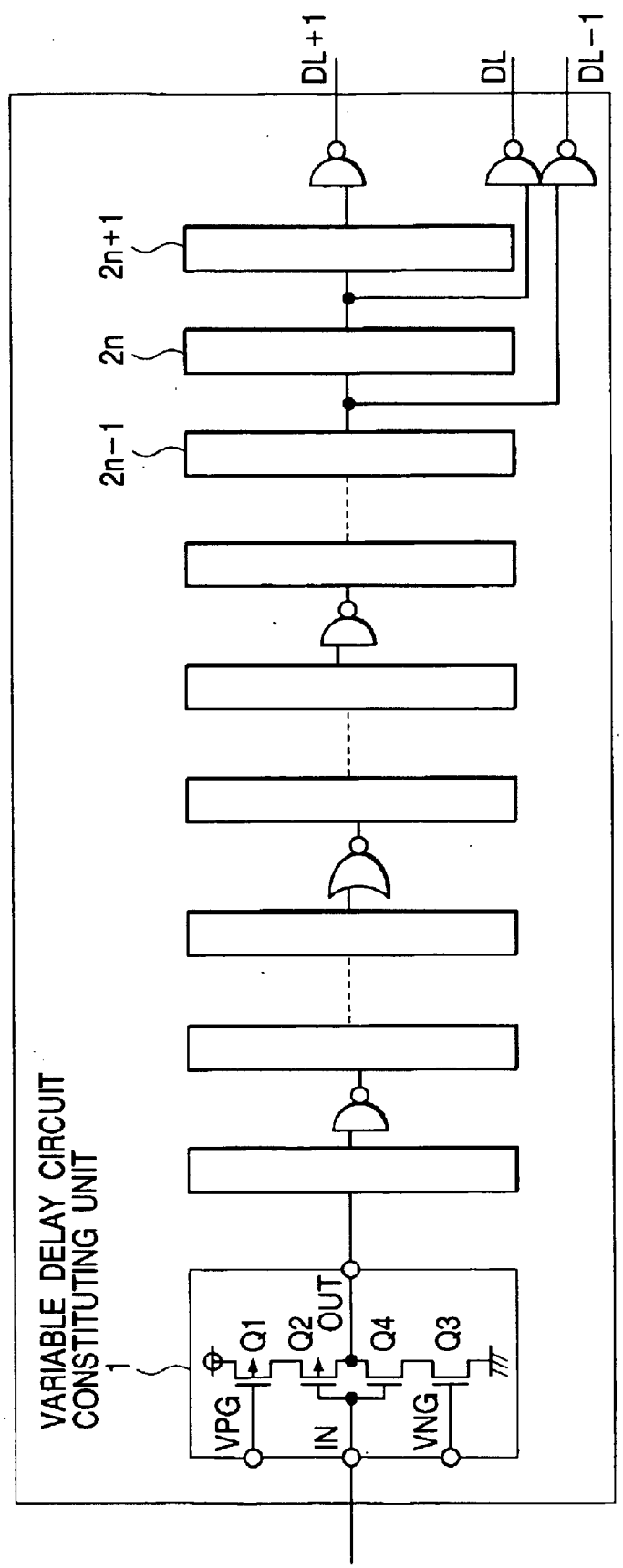
FIG. 2 is a circuit diagram illustrating an embodiment of a variable delay circuit used in the present invention.

FIG. 2 illustrates a circuit diagram of an embodiment of the variable delay circuit used in the present invention. The variable delay circuit of this embodiment is formed as the circuit for outputting the nodes of the delay circuits in the 2n−1 stages for the delay circuit DL−1, 2n stages for the delay signal DL and 2n+1 stages for the delays signal DL+1, by cascade-connecting a plurality of variable delay circuits configured with CMOS inverter consisting of a P-channel MOSFET Q2 and an N-channel MOSFET Q4 which forms an output signal OUT by controlling the respective currents with gate voltage VPG of a. P-channel MOSFET Q1 and gate voltage VNG of an N-channel MOSFET Q3 and then receiving an input signal IN. The gate provided in the course of the circuit is used to reset an output signal of the variable delay circuit for adjustment.

It is desirable for the MOSFETs Q1 and Q3 to provide in parallel the P-channel MOSFET and N-channel MOSFET which allow flow of a constant current by receiving a constant voltage in order to enable signal transmission when the absolute values of the control voltages VPG and VNG are lowered. Namely, since such constant current MOSFET is provided, even if the absolute values of the control voltages VPG and VNG are lowered and thereby the MOSFETs Q1 and Q3 are turned off, the stable delay operation can be realized by operating the CMOS inverter with the constant current and setting the maximum delay time in the unit delay circuit with such constant current.

Figure 3:
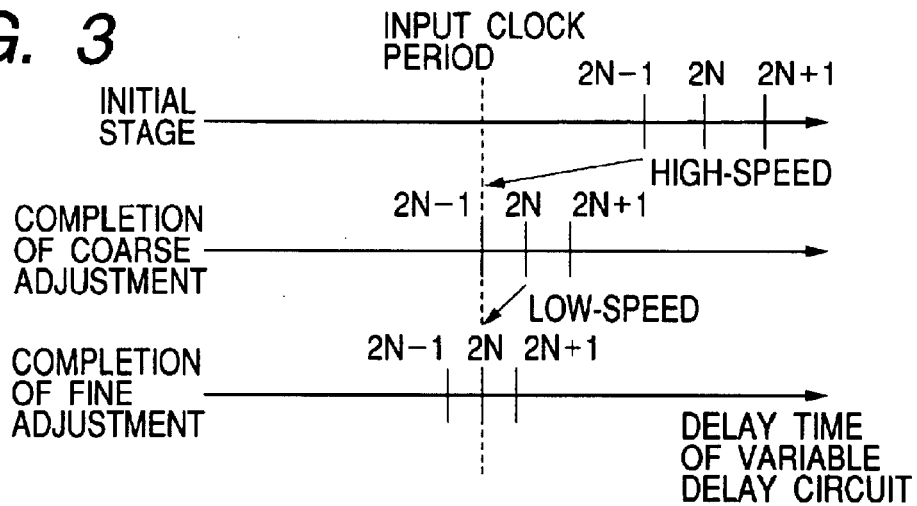
FIG. 3 is a diagram for describing the synchronizing operation through coarse adjustment/fine adjustment in the DLL circuit of the present invention.

FIG. 3 is a diagram for describing the synchronizing operation of the coarse adjustment and fine adjustment in the DLL circuit of the present invention. In this figure, the input clock period is considerably smaller than the delay time of the variable delay circuit. That is, since the delay time of the variable delay circuit is too large, the coarse adjustment synchronizing operation is implemented for matching between the delay signal DL−1 of the (2N−1)th stage of the variable delay circuit 1 and the input pulse. In this synchronizing operation, since a loop gain of the DLL is set to a larger value, the delay signal DL−1 of the (2N−1)th stage is quickly matched with the input clock period.

When the synchronizing operation is completed through the coarse adjustment, the operation shifts to the fine adjustment synchronizing operation. In this fine adjustment synchronizing operation, since a loop gain of the DLL is set to a smaller value, the standard delay signal DL of the 2Nth stage is gradually matched with the input clock period. Although the fine adjustment synchronizing operation is performed rather in low speed as described above, but phase control itself is performed within short period corresponding to the delay time in one stage of the variable delay circuit 1. Accordingly, the time required for the synchronizing operation becomes rather short. Namely, the time required for total synchronizing operation including the coarse adjustment and fine adjustment processes can be set to an extremely short period through completion of the synchronizing operation within a short period in the coarse adjustment operation. Moreover, stable synchronizing operation in higher accuracy, in other words, the synchronizing operation including less amount of jitter can be realized in order to finally realize the target synchronization with input clock through the fine adjustment synchronizing operation.

Figure 4:
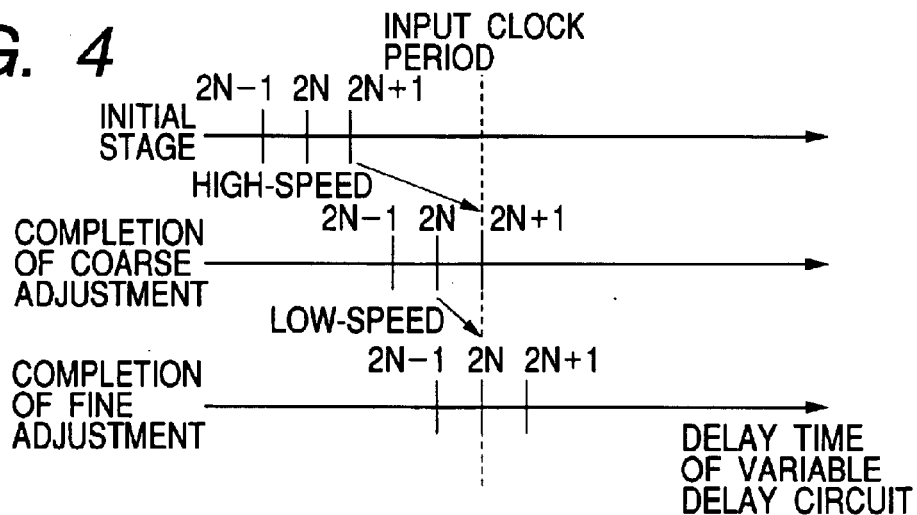
FIG. 4 is a diagram for describing the synchronizing operation through coarse adjustment/fine adjustment in the DLL circuit of the present invention.

FIG. 4 is a diagram for describing the coarse adjustment and fine adjustment synchronizing operation in the DLL circuit of the present invention. In this figure, the input clock period is set considerably smaller than the delay time of the variable delay circuit. Namely, since the delay time of the variable delay circuit is too small, the coarse adjustment synchronizing operation can be implemented for matching between the delay signal DL+1 of the (2N+1)th stage of the variable delay circuit 1 and the input pulse. In this synchronizing operation, since the loop gain of the DLL is set to a larger value, the delay signal DL+1 of the (2N+1)th stage is quickly matched with the input clock period.

When the coarse adjustment synchronizing operation is completed, the operation shifts to the fine adjustment synchronizing operation. In this fine adjustment operation, since the loop gain of the DLL is set to a smaller value, the standard delay signal DL of the 2Nth stage is gradually synchronized with the input clock period. As described above, although the fine adjustment operation is performed rather in low speed, since the phase control itself is performed within a short period corresponding to the delay time in one stage of the variable delay circuit 1, the time required for synchronizing operation becomes short and moreover stable synchronizing operation with less amount of jitter can be realized.

Figure 5:
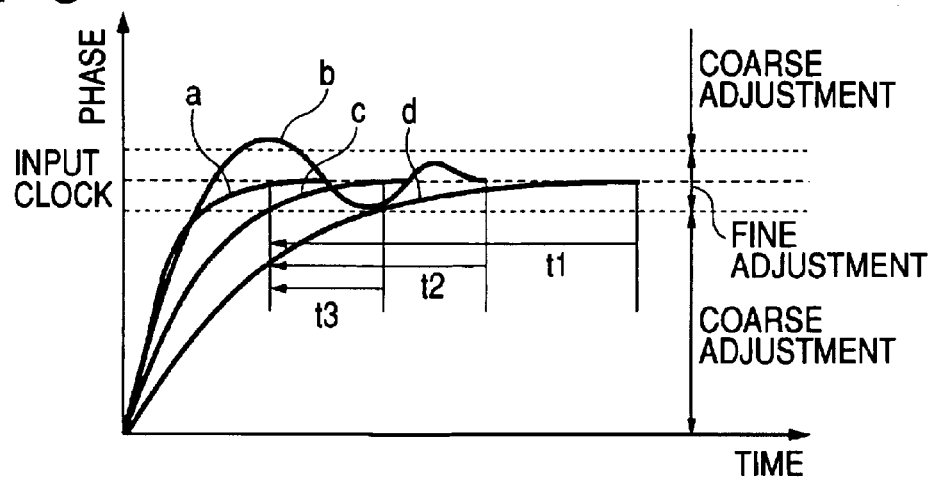
FIG. 5 is an operation characteristic diagram for describing the DLL circuit of the present invention.

FIG. 5 is an operation characteristic diagram for describing the DLL circuit of the present invention. In this figure, time is plotted on the horizontal axis, while phase (frequency) on the vertical axis. The DLL circuit of the present invention quickly changes the phase (frequency) by increasing the loop gain of the DLL in the coarse adjustment range as illustrated in the characteristic (a). In the fine adjustment region, the loop gain of the DLL is lowered to gradually change the phase (frequency). Thereby, the phase can be synchronized to the target input clock within a short period of time.

Meanwhile, when the loop gain of the DLL is kept constant, if the phase is controlled to rise quickly by setting the loop gain of the DLL to higher value as illustrated with the characteristic (b), over-swing appears first and it is converged while drawing the locus of vibration. Therefore, the time required until the synchronization is obtained is extended as longer as t2. Although not illustrated, here rises a problem that jitter (swaying of phase) is generated due to excessive reaction to delicate phase deviation against the input pulse. Moreover, when it is attempted to form the stable synchronizing clock including less amount of jitter by setting the loop gain of the DLL to small value as illustrated by the characteristic (d), the time required until the synchronization is attained is further extended as longer as t1. The characteristic (c) is an example of the characteristic obtained in the case where the optimum condition is set without any over-swing. Even when such optimum condition is set, the time required until the synchronization is attained is also extended as longer as t3. When fluctuation or the like of element characteristics is considered here, the synchronizing operation under the optimum condition is actually difficult to realize and the time longer than the time t3 is after all required.

In the present invention, since it is not required to consider over-swing in the coarse adjustment range, on the contrary, since the fine adjustment is started because the loop gain of the DLL is small and the operation is automatically changed over before the matching is realized even if the loop gain of the DLL is set to larger value and the signal thereby rises quickly, high speed convergence can be attained through the operation to realize gradual phase matching (synchronization) from the fine adjustment without any over-swing. Accordingly, the DLL circuit which simultaneously realizes both higher sensitivity (high response characteristic) and higher stability can be achieved.

Figure 6:
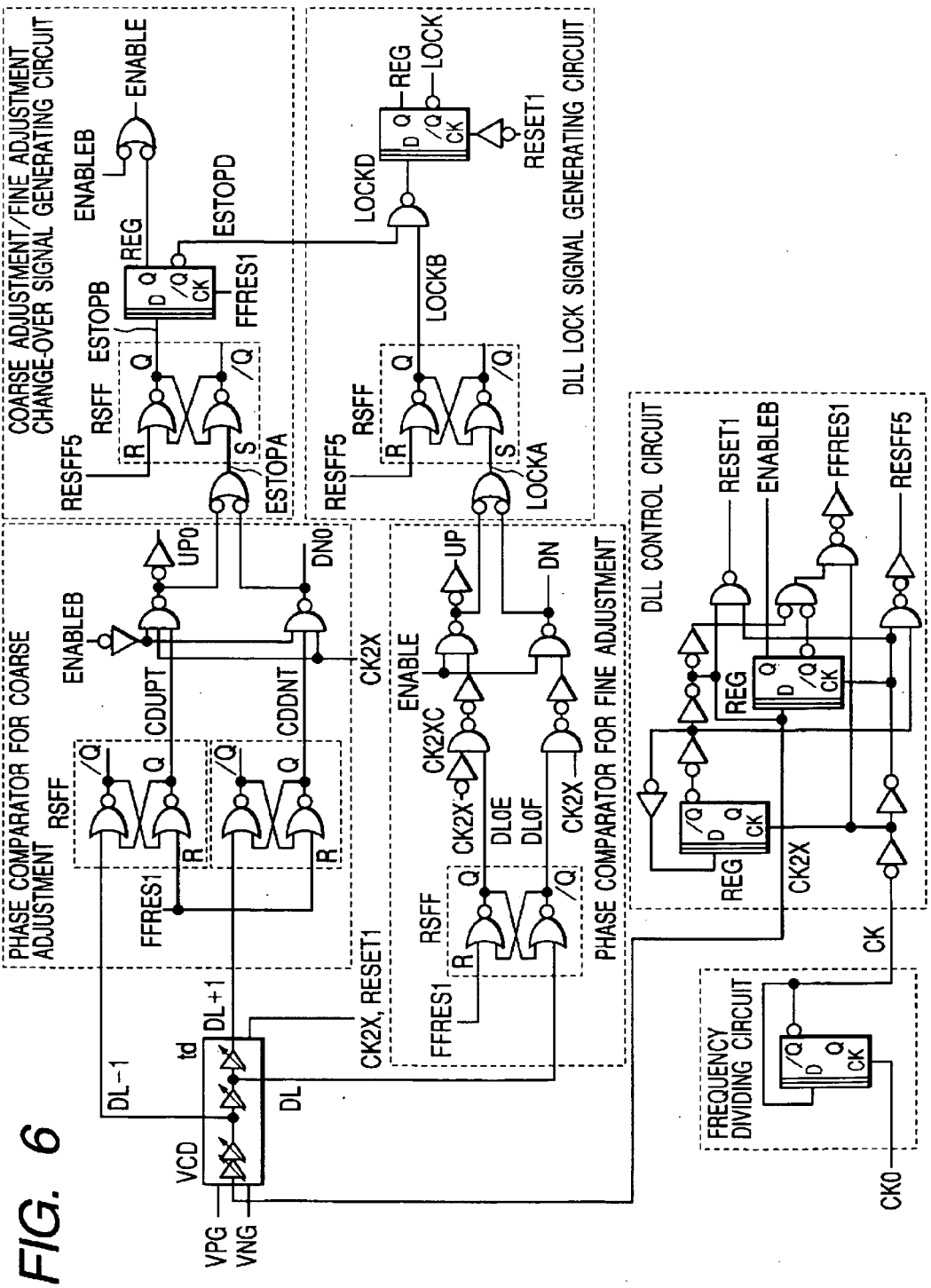
FIG. 6 is a circuit diagram illustrating an embodiment of a control system circuit of the DLL circuit of the present invention.

FIG. 6 illustrates a circuit diagram of an embodiment of a control system circuit of the DLL circuit of the present invention. VCD is the variable delay circuit 1 to form the standard delay signal DL to be synchronized with the input pulse, the delay signal DL−1 of one preceding stage, and the delay signal DL+1 of one subsequent stage, as described above. The control system circuit of this embodiment is constituted by the DLL control circuit, coarse adjustment phase comparator, fine adjustment phase comparator, coarse adjustment/fine adjustment change-over signal generating circuit and DLL LOCK signal generating circuit.

The DLL circuit of this embodiment is not configured to always compare the input pulse with the delayed pulse of the variable delay circuit VCD by the phase comparator but to perform once the phase comparing operation in every four periods of the input pulse by the control signal formed in the DLL control circuit. Namely, in the DLL control circuit, a latch circuit REG forms the pulse which is divided in the frequency to ¼ and this frequency-divided pulse is then combined with the input pulse CK. Thereby, the set pulses RESET1, FFRES1, RESFF5 are formed once in every four periods of the input pulse CK and the enable signal ENABLEB which validates the phase comparison operation can also be formed.

The phase comparator for coarse adjustment forms the pulse CDUPT under the condition that delay is too large, by setting, with the delay signal DL−1, one flip-flop circuit RSFF which has been reset by the reset pulse FFRES1 generated by the DLL control circuit and also forms an up signal UP0 through comparison of the pulse DCUPT with the input pulse CK2X (¼ frequency division pulse of the input pulse CK0). On the contrary, the pulse CDDNT under the condition that delay is too small is generated by setting, with the delay signal DL+1, the other flip-flop circuit RSFF which has been reset by the reset pulse FFRES1 and this pulse CDDNT is then compared with the input pulse CK2X (¼ frequency division pulse of the input pulse CK0). Thereby, the down signal DN0 is formed.

With the structure described above, the phase comparator for coarse adjustment forms the up signal UP0 when the phase of the delay signal DL−1 is delayed from the input pulse CK0 (CK2X) and also forms the down signal DN0 when the phase of the delay signal DL+1 is leading for the input pulse CK0 (CK2X). In other cases, namely when phase difference between the standard delay signal DL and input pulse is in the range of DL−1 and DL+1, the signals UP0, DN0 are never formed.

When the up signal UP0 or down signal DN0 is formed, the flip-flop circuit RSFF of the coarse adjustment/fine adjustment change-over signal generating circuit is set. This flip-flop circuit RSFF is comprised to the latch circuit REG to generate an enable signal ENBLE via a gate circuit. This signal ENBLE validates the operations of the phase comparator for fine adjustment.

The phase comparator for fine adjustment forms the comparison pulses DL0E and DL0F by setting, with the delay signal DL, the flip-flop circuit RSFF which has been reset by the reset pulse FFRES1 generated by the DLL control circuit and also forms the up signal UP and down signal DN through comparison with the input pulse CK2X (¼ frequency division pulse of the input pulse CK0). The enable signal ENBLE is used to form these up signal UP and down signal DN.

In the phase comparator for fine adjustment, the up signal UP and down signal DN are never generated under the lock condition where the phase of the input pulse CX2 is matched with the phase of the delay signal DL. The DLL LOCK signal generating circuit detects, with the flip-flop circuit RSFF, that any of the up signal UP and down signal DN is never generated and generates a lock detection signal LOCK with the logical operation with the synchronization signal from the coarse adjustment/fine adjustment change-over signal generating circuit. Although not particularly restricted, this lock detection signal LOCK is used to notify to the other circuits that the DLL circuit is in the lock condition. The DLL circuit does not require the DLL LOCK detection signal generating circuit as the essential circuit and uses as required depending on the request from the circuit which uses the DLL circuit.

In this embodiment, phase synchronization within a short period of time and stability under the synchronized condition are realized through combination of the phase comparator for coarse adjustment, phase comparator for fine adjustment, coarse adjustment/fine adjustment change-over signal generating circuit for changing over these comparators and the DLL control circuit for controlling the operations of these elements. Under the synchronized condition described above, if period of the input pulse changes to a large extent exceeding the ranges of DL−1 and DL+1 of the phase difference between the standard delay signal DL and input pulse with a certain reason, the phase comparator for coarse adjustment forms again the up signal UP0 or down signal DN0. Accordingly, since the coarse adjustment/fine adjustment change-over signal generating circuit restricts an output signal of the phase comparator for fine adjustment and gives priority to the output signal UP0 or DN0 of the phase comparator for coarse adjustment, the phase control operation is performed to bring the phase difference between the standard delay signal DL and input pulse into the range of DL−1 and DL+1 within an extremely short period of time and thereafter the synchronizing operation with the phase comparator for fine adjustment is implemented.

Figure 7:
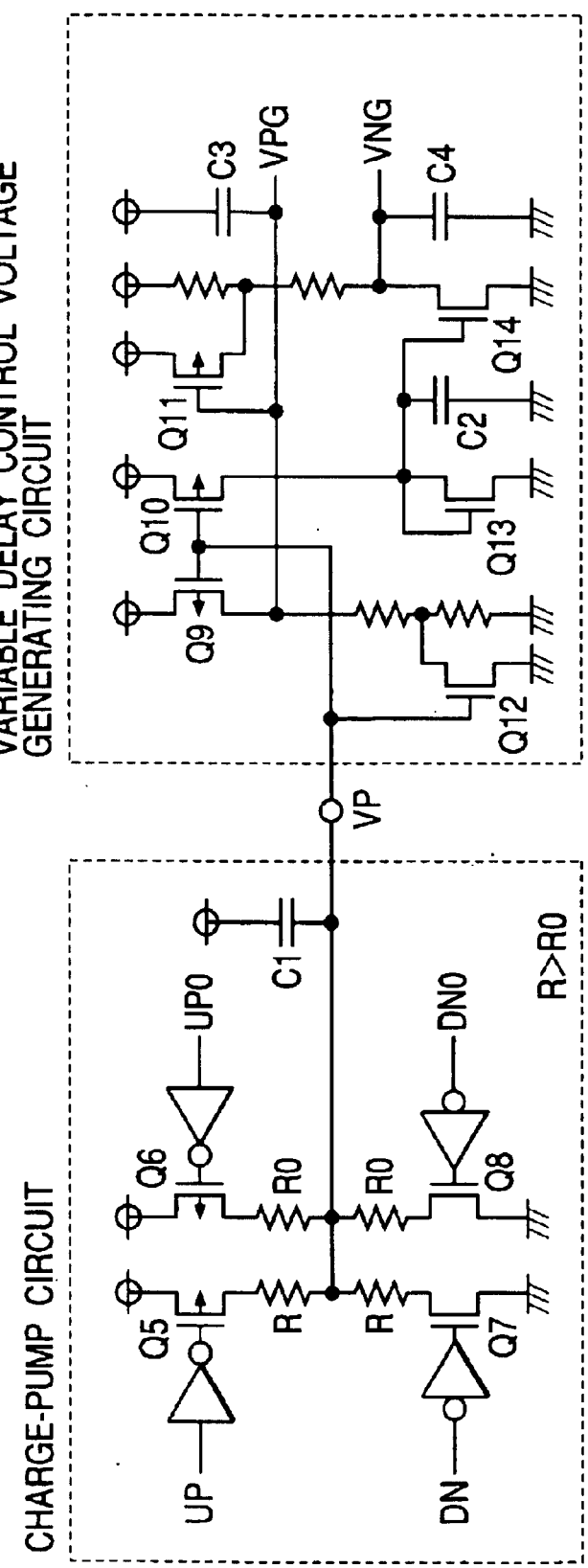
FIG. 7 is a circuit diagram illustrating an embodiment of a charge pump & filter of FIG. 1.

FIG. 7 illustrates a circuit diagram of an embodiment of the charge pump & filter of FIG. 1. In addition to the charge pump circuit, a variable delay control voltage generating circuit is further added to the charge pump & filter of this embodiment. The up signal UP is supplied to a gate of a P-channel MOSFET Q5 via an inverter circuit for drive in order to allow a current to flow to raise a holding voltage of a smoothing capacitor C1 via a resistor R. The down signal Dn is supplied to a gate of an N-channel MOSFET Q7 via the inverter circuit for drive in order to allow a current to flow to lower the holding voltage of the smoothing capacitor C1 via the resistor R.

The up signal UP0 described above is supplied to a gate of a P-channel MOSFET Q6 via the inverter circuit for drive and allows a current to flow to raise the holding voltage of the smoothing capacitor C1 via a resistor R0. The down signal DN0 is supplied to a gate of an N-channel MOSFET Q8 via the inverter for drive and allows a current to flow to lower the holding voltage of the capacitor C1 via the resistor R0.

Here, quick change of phase in the coarse adjustment operation can be realized through increase of the current to change the holding voltage of the capacitor C1 with the coarse adjustment signal UP0 or DN0, namely through increase of the loop gain of the DLL by setting the conductance of the MOSFETs Q5 to Q8 to satisfy the relationships of Q6<Q5, Q7<Q8 and also setting the resistance value of the resistor to satisfy the relationship of R>R0. On the contrary, gradual change of phase in the fine adjustment can be realized through decrease of the current to change the holding voltage of the capacitor C1 with the fine adjustment signal UP or DN, namely through decrease of the loop gain of the DLL by reducing the current flowing into the MOSFETs Q5 and Q7 and thereby increasing the resistance value of the resistor R.

Figure 8:
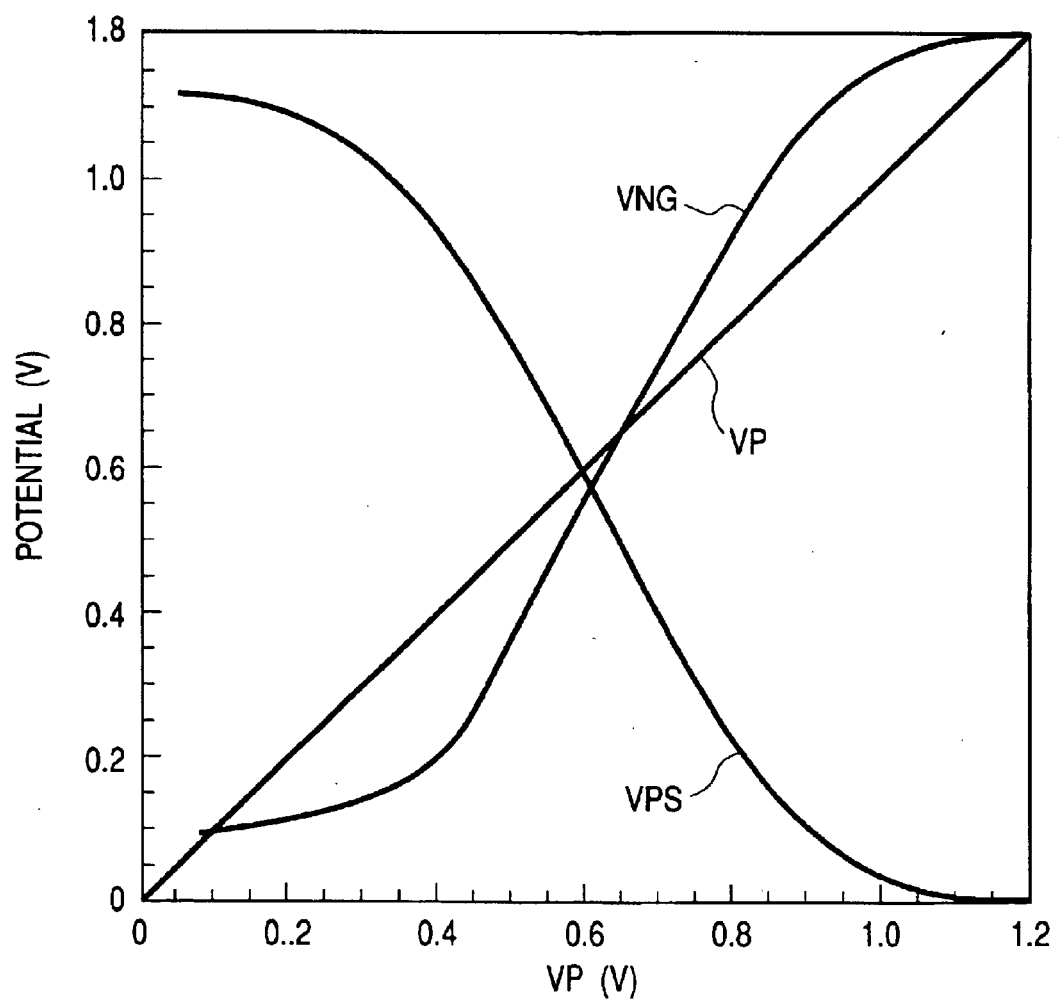
FIG. 8 is a voltage conversion characteristic of a variable delay control voltage generating circuit of FIG. 7.

The holding voltage VP of capacitor C1 is converted to the control voltages VNG and VPG as illustrated in FIG. 8 with the variable delay control voltage generating circuit. Namely, the voltage VP is supplied to the gates of the P-channel MOSFETs Q9 and Q10 and is then converted to the current signals. The current of the MOSFET Q9 is used to discharge a capacitor C3, a MOSFET Q12 which receives the voltage VP with the gate thereof and a resistor connected to this transistor Q12 constitute the charge current path of the capacitor C3, and the control voltage VPG which is obtained by inverting the voltage VP can be formed through combining with the discharge current of the MOSFET Q9. This control voltage VPG is supplied to the gate of the P-channel MOSFET Q1 or the like of FIG. 2.

The current formed by the MOSFET Q10 is supplied a current Miller circuit consisting of the N-channel MOSFETs Q13 and Q14 and an output current of this Miller circuit is used as a discharge current of a capacitor C4. A MOSFET Q11 which receives the voltage VPG at the gate thereof and a resistor connected to this Q11 form a charge current path of the capacitor C4 and the control voltage VNG which changes like the voltage VP is formed through combining with the discharge current of the MOSFET Q14. This control voltage VNG is supplied to the gate of the N-channel MOSFET Q3 or the like of FIG. 2.

Operation current control range of the CMOS inverter circuit forming the variable delay circuit can be widened by converting the voltage VP formed by the capacitor C1 for smoothing the phase comparison output to the complementary control voltages VPG and VNG as described above and, as a result, the variable delay range in the CMOS inverter circuit can also be widened. In this case, it is desirable to respectively provide, in the variable delaying stage of FIG. 2, the P-channel MOSFET and N-channel MOSFET which can supply a constant current to the MOSFETs Q1 and Q3 corresponding to the maximum delay time in the parallel condition.

Figure 9A:
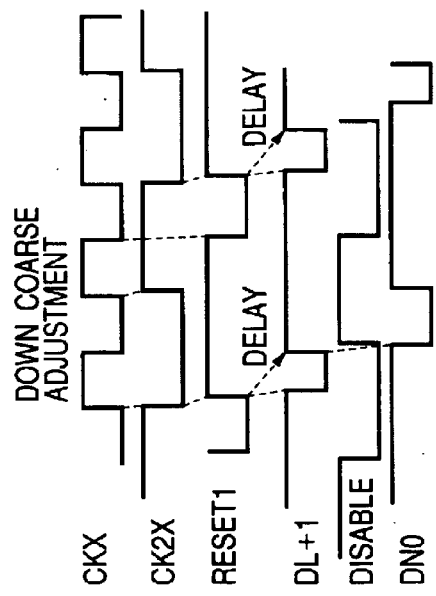
FIGS. 9(a) to 9(d) are waveform diagrams for describing operations of the DLL circuit of the present invention.
Figure 9B:
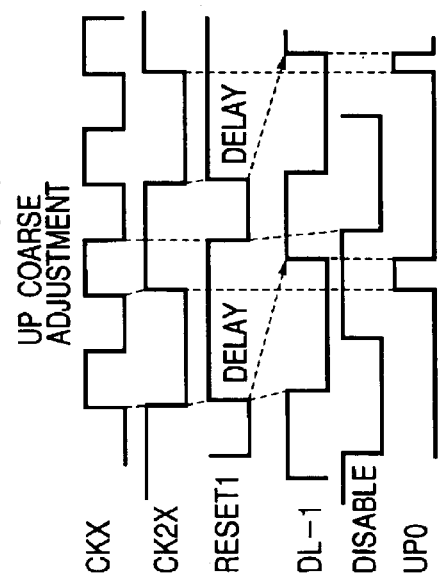
Figure 9C:
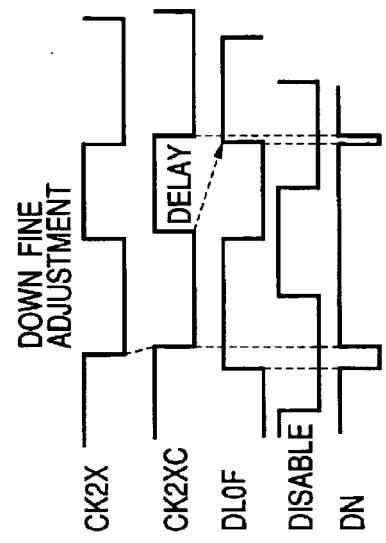
Figure 9D:
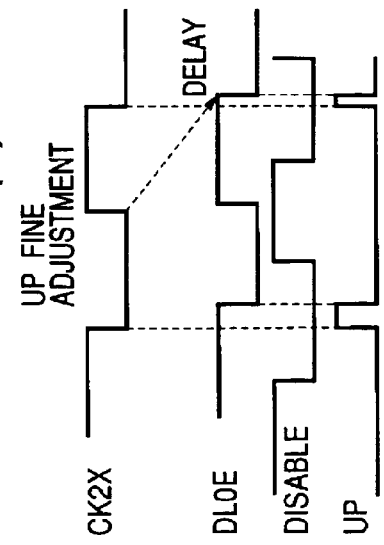

FIGS. 9(a) to 9(d) are waveform diagrams for describing operations of the DLL circuit of the present invention. FIG. 9(a) is a waveform diagram under the up-frequency (UP) condition in the coarse adjustment, while FIG. 9(b) is a waveform diagram under the down-frequency (DN) condition in the coarse adjustment, FIG. 9(c) is a waveform diagram under the up-frequency (UP) condition in the fine adjustment and FIG. 9(d) is a waveform diagram under the down-frequency (DN) condition in the fine adjustment.

As shown in FIG. 9(a), in the UP coarse adjusting operation, a phase difference between rises of the ½ frequency division pulse CK2X of the input pulse CKX and the delay signal DL−1 (CDUPT in FIG. 6) is outputted as the up signal UP0 during the high level period of the signal DISABLE (=low level period of the enable signal ENABLEB). This signal UP0 raises the potential VP of the capacitor C1, the gate control voltage VNG of the N-channel MOSFET Q3 rises conforming to the characteristic of FIG. 8 in order to increase a current, and the gate control voltage VPG of the P-channel MOSFET Q1 decreases in order to increase a current. Thereby, the delay time in the unit variable delay stage becomes short and phase matching between the delay signal DL−1 and the input pulse CK2X is performed quickly as illustrated in FIG. 3.

As shown in FIG. 9(c), the UP fine adjusting operation is selected and executed after completion of the coarse adjustment. With this operation, the up signal UP is formed corresponding to the phase difference between the input pulse CK2X and delay signal DL0E to increase the potential VP of the capacitor C1 as described above. Thereby, the delay time of the unit variable delay circuit is shortened conforming to the characteristic of FIG. 8. In this case, since changing rate of the voltage VP of the capacitor C1 due to the up signal UP becomes small, in other words, since the loop gain of DLL is small, changing width of the delay time in the variable delay circuit 1 is also reduced.

As shown in FIG. 9(b), in the DOWN coarse adjusting operation, phase difference between rises of the delay signal DL+1 (CDDNT of FIG. 6) and the ½ frequency division pulse CK2X of the input pulse CKX is outputted as the down signal DN0 during the high level period of the signal DISABLE (=low level period of the enable signal ENABLEB). This signal DN0 reduces the potential VP of the capacitor C1. Thereby, the gate control voltage VNG of the N-channel MOSFET Q3 falls conforming to the characteristic of FIG. 8 as described above to reduce a current and the gate control voltage VPG of the P-channel MOSFET Q1 rises to reduce a current. Accordingly, the delay time in the unit variable delay stage becomes long and phases matching is performed quickly between the delay signal DL+1 and input pulse CK2X as illustrated in FIG. 4.

As shown in FIG. 9(d), the DOWN fine adjusting operation is selected and executed after completion of the coarse adjustment. With this operation, the down signal DN is formed corresponding to phase difference between the input pulse CK2X and the delay signal DL0F. Accordingly, the potential VP of the capacitor C1 is reduced as described above and the delay time of the unit variable delay circuit becomes longer conforming to the characteristic of FIG. 8. In this case, since changing rate of the voltage VP of the capacitor C1 due to the down signal DN is small, in other words, since the loop gain of DLL is small, changing width of the delay time in the variable delay circuit 1 is also reduced.

Figure 10B:
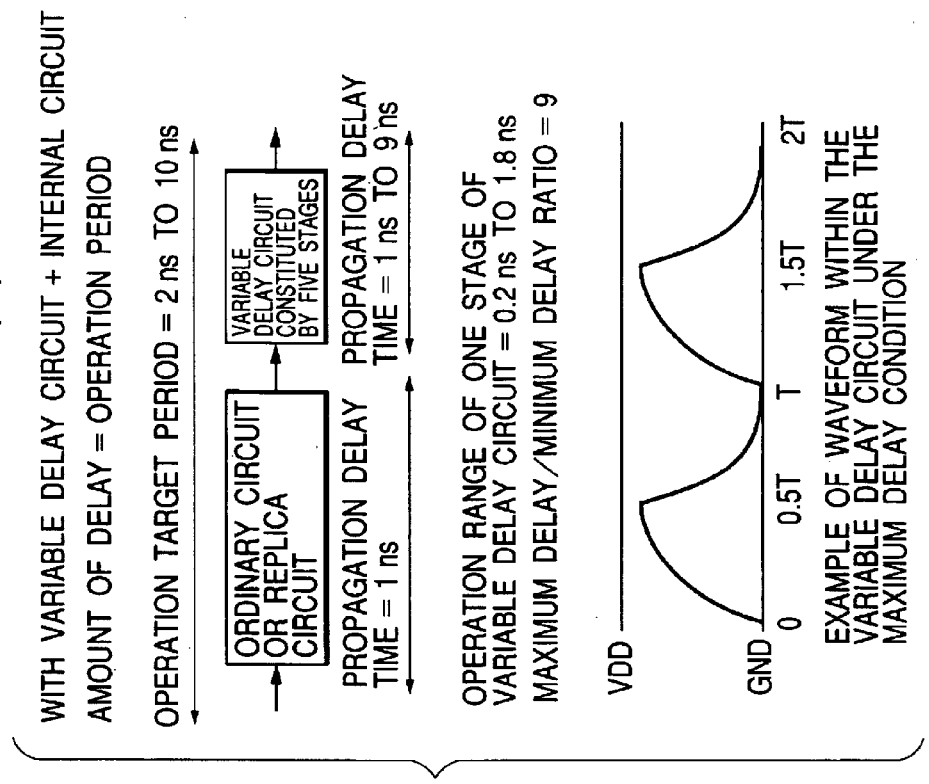
FIGS. 10(a) and 10(b) are diagrams for describing requested operation ranges of the variable delay circuit in relation to the present invention.
Figure 10A:
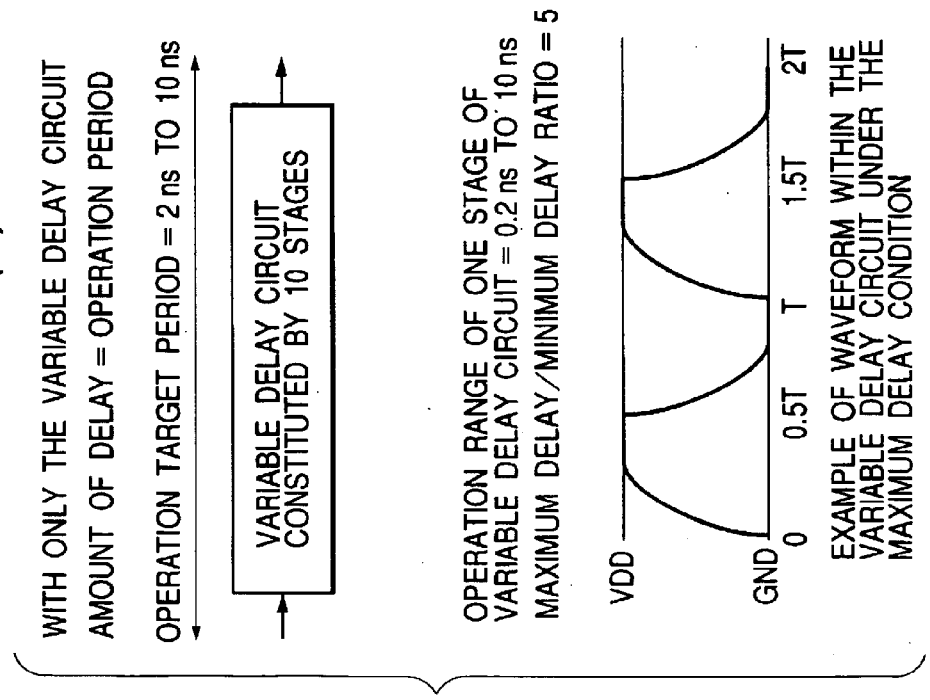

FIGS. 10(a) and 10(b) are diagrams for describing the requested operation range of the variable delay circuit. In FIG. 10(a), the operation target period is controlled only with the variable delay circuit. For example, when the operation target period is 2 ns to 10 ns, the unit variable delay stage of FIG. 2 is constituted by 10 stages thereof. Meanwhile, in FIG. 10(b), the unit variable delay stage formed of a variable delay circuit + an internal circuit. As the internal circuit, an ordinary circuit and replica circuit are used. In this example, since the fixed delay time of 1 ns in the ordinary circuit and replica circuit is included to realize the operation target period of 2 ns to 10 ns as described above, the unit delay circuit of five stages is used as the variable delay circuit and it is therefore required to realize the delay time of 1 ns to 9 ns with such unit variable delay circuit of five stages.

In FIG. 10(a), operation range per stage of the variable delay circuit is ranged from 0.2 ns to 1.0 ns, resulting in the maximum delay/minimum delay ratio of 5. Meanwhile in FIG. 10(b), operation range per stage of the variable delay circuit is ranged from 0.2 ns to 1.8 ns, resulting in the maximum delay/minimum delay ratio of 9. This fact suggests that when the circuit is formed of the same identical elements, the internal waveform of the variable delay circuit under the maximum delay condition can be considered as the signal having the full amplitude in the rage of the operation voltage VDD-VSS.

However, in FIG. 10(b), the internal waveform of the variable delay circuit under the maximum delay condition cannot show the full amplitude in the range of the operation voltage VDD-VSS. Namely, when the signal rises slowly because the operation current of the CMOS inverter circuit is narrowed to rise slowly (or falls slowly) in view of obtain longer delay time, the input signal changes to the high level before it reaches the power supply voltage VDD and thereby controls the output signal to fall.

As described above, it is difficult to equally set the currents of the P-channel MOSFET and N-channel MOSFET in the structure to change the delay time by controlling the operation current of the CMOS inverter circuit with the MOSFETs Q1 and Q3 and there exists the offset which makes large any current desired. As a result, here rises a problem that the pulse to be transmitted disappears in the course of the sequential transmission of the signal which cannot show the full amplitude as described above. Accordingly, even in the case of obtaining the predetermined delay time only with the variable delay circuit as illustrated in FIG. 10(a), there rises a problem, as in the case of FIG. 10(b), that the pulse to be transmitted disappears in the course of the sequential transmission of the signal which cannot show the full amplitude because the input pulse frequency becomes high.

FIGS. 11(a) and 11(b) are diagrams illustrating examples of the measures for disappearance of pulse illustrated in FIGS. 10(a) and 10(b). In FIG. 11(a), the variable delay circuit is operated in the doubled period by dividing the frequency of the input pulse to ½, while in FIG. 11(b), the variable delay circuit is operated in the period of four (4) times by dividing the frequency of the input pulse to ¼. With such ½ frequency division, the operation target period of 2 ns to 10 ns can be expanded to 4 ns to 20 ns and with such ¼ frequency division, the operation target period of 2 ns to 10 ns can be expanded to 8 ns to 40 ns.

Accordingly, when the fixed delay time of the replica circuit can be assumed as 1 ns, the number of stages of the unit variable delay stage of the variable delay circuit can be increased up to 16 stages in the case of the ½ frequency division, while it can be increased up to 32 stages in the case of the ¼ frequency division. As a result, in the case of the ½ frequency division, the operation range per stage of the variable delay circuit is ranged from 0.2 ns to 1.27 ns, resulting in the maximum delay/minimum delay ratio of 6.33. In the case of the ¼ frequency division, such operation range is ranged from 0.2 ns to 1.11 ns, resulting in the maximum delay/minimum delay ratio of 5.55. Moreover, the internal waveform of the variable delay circuit under the maximum delay condition can be defined, as illustrated in FIG. 10(a), as the signal showing the full amplitude in the range of the operation voltage VDD-VSS.

Since the variable delay circuit 1 executes the phase synchronizing control in the circuit of the embodiment illustrated in FIG. 1, disappearance of pulse in the variable delay circuit 1 can be prevented by providing the frequency divider as described above to extend the period of pulse to be transmitted. Meanwhile, since the variable delay circuit 2 has to delay the signal while the input signal period is maintained, the waveform can easily be disappeared with the reason described above. In the embodiment of FIG. 1, a multiphase signal for reducing the operation period of the variable delay circuit 2 is generated and this multiphase signal is then transmitted to the variable delay circuit 2 in order to prevent deformation or disappearance of signal waveform. The problem of such disappearance and deformation of the pulse can be solved by recovering, by the waveform combining circuit, the signal having the original period from a plurality of signals.

Figure 12:
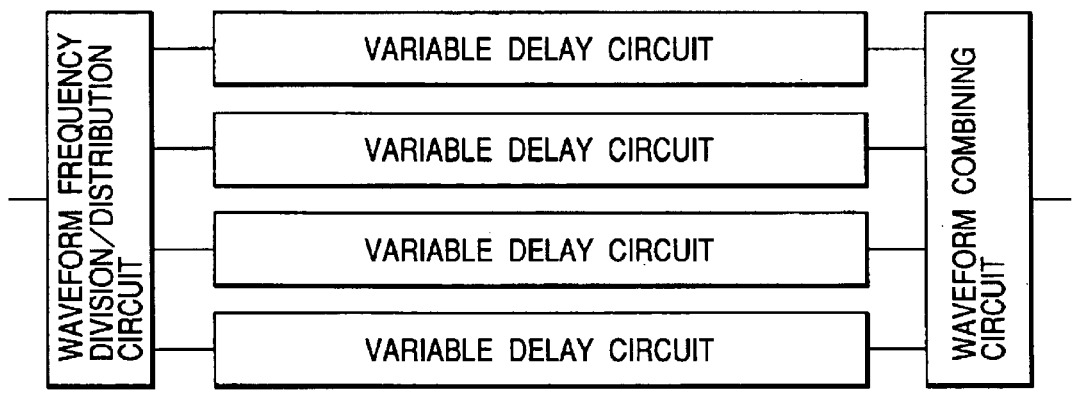
FIG. 12 is a block diagram illustrating an embodiment of a frequency divider/distributor, a variable delay circuit 2 and a waveform combiner.

FIG. 12 illustrates a block diagram of an embodiment of the frequency divider/distributor, variable delay circuit 2 and waveform combiner of FIG. 1. In this embodiment, the input pulse is frequency-divided to ¼ by the waveform frequency diving and distributing circuit and distributed to four pulses having the phase which are different in every half-period from the phase of the input pulse. These four pulses are then transferred to the four variable delay circuits. The waveform combining circuit combines four delay signals to regenerate the output signal having the period equal to that of the input pulse.

Figure 13:
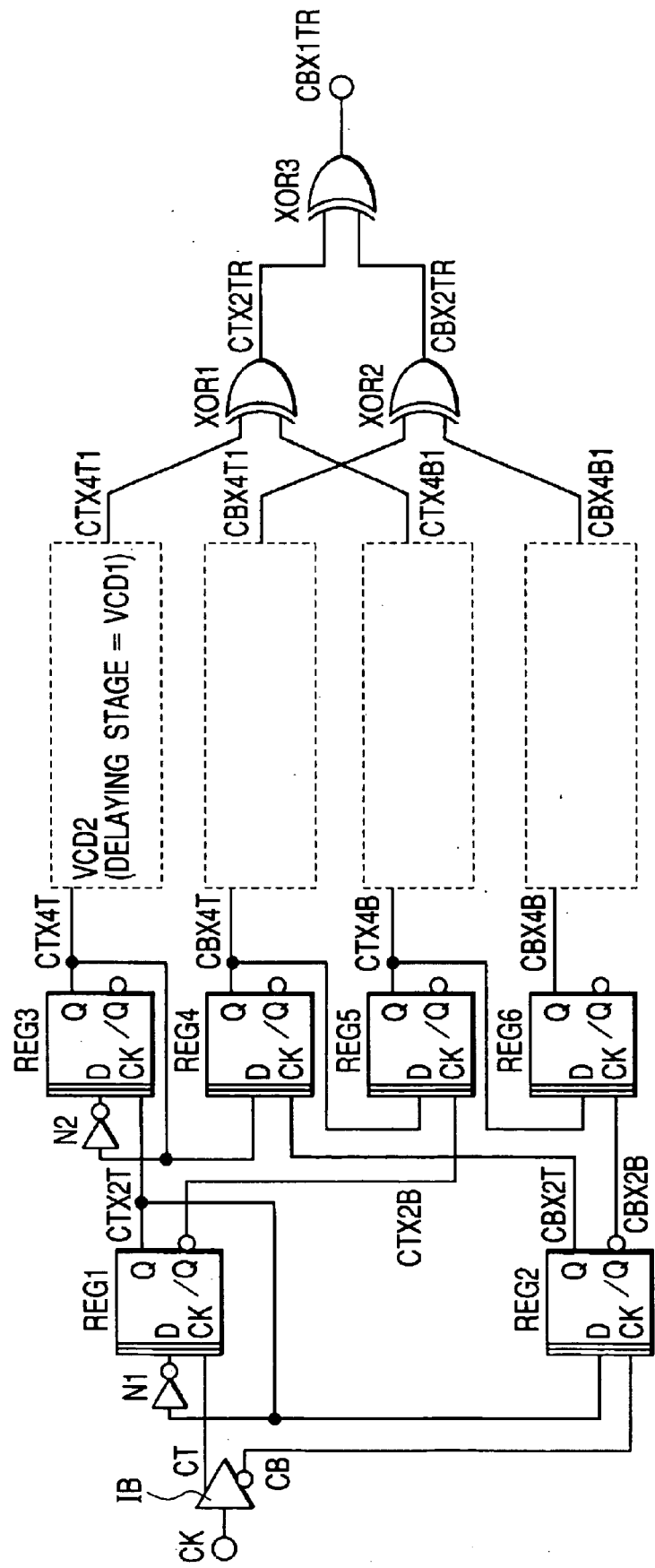
FIG. 13 is a circuit diagram illustrating an embodiment of the frequency divider/distributor, variable delay circuit 2 and waveform combiner of FIG. 12.
Figure 14:
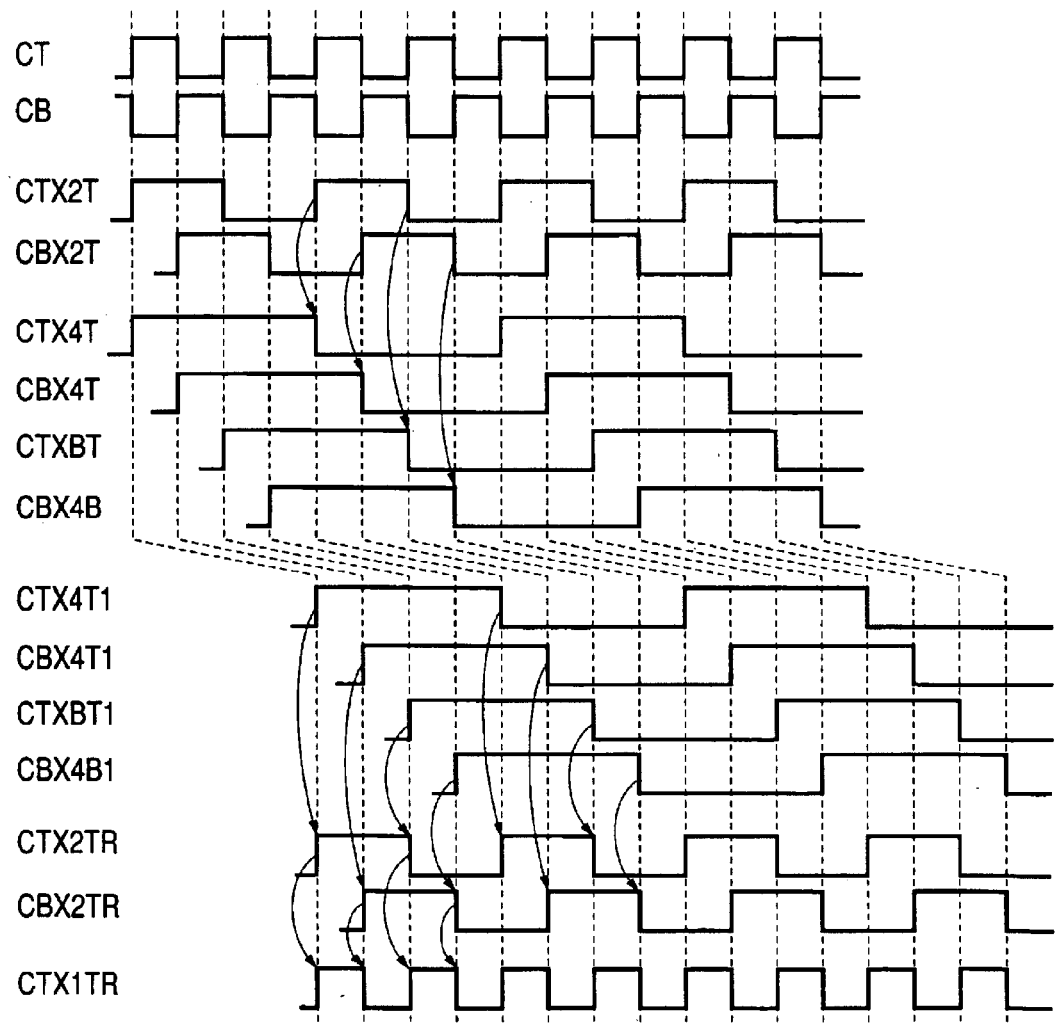
FIG. 14 is an operation waveform diagram for describing operations of the circuit of FIG. 13.

FIG. 13 illustrates a circuit diagram of an embodiment of the frequency divider/distributor, variable delay circuit 2 and waveform combiner of FIG. 12. The input pulse CK is applied to an input buffer IB to form a normal phase output CT and an inverted phase output CB as illustrated in the operation waveform diagram of FIG. 14. These outputs are frequency-divided with registers (½ frequency dividers) REG1, REG2. Thereby, the signal CTX2T (inverted signal CXT2B, not illustrated) and the signal CBX2T (inverted signal CBX2B, not illustrated) can be formed.

The respective output signals are fed back to the other register to realize the ½ frequency dividing operation using the signals CTX2T, CXT2B and CBX2T, CBX2B as the clocks of registers (½ frequency dividers) REG3 to REG6. Thereby, the four pulses CTX4T, CBX4T, CTX4B, CBX4B having the period of four times and deviated in every half-period from the input pulse CK are formed and these pulses are then transferred to the variable delay circuit VCD2 in the same number of delaying stages as the variable delay circuit 1 (VCD1) of FIG. 1. An output signal CTX1TR corresponding to the original pulse can be regenerated from these delay signals through the waveform combining circuit formed of the exclusive OR circuits XOR1, XOR2 and XOR3. This structure described above can effectively prevent disappearance and deformation of pulse in the variable delay circuit VCD2 and can generate an output signal CTX1TR which is accurately phase-synchronized in the frequency range up to higher frequency band.

Figure 15:
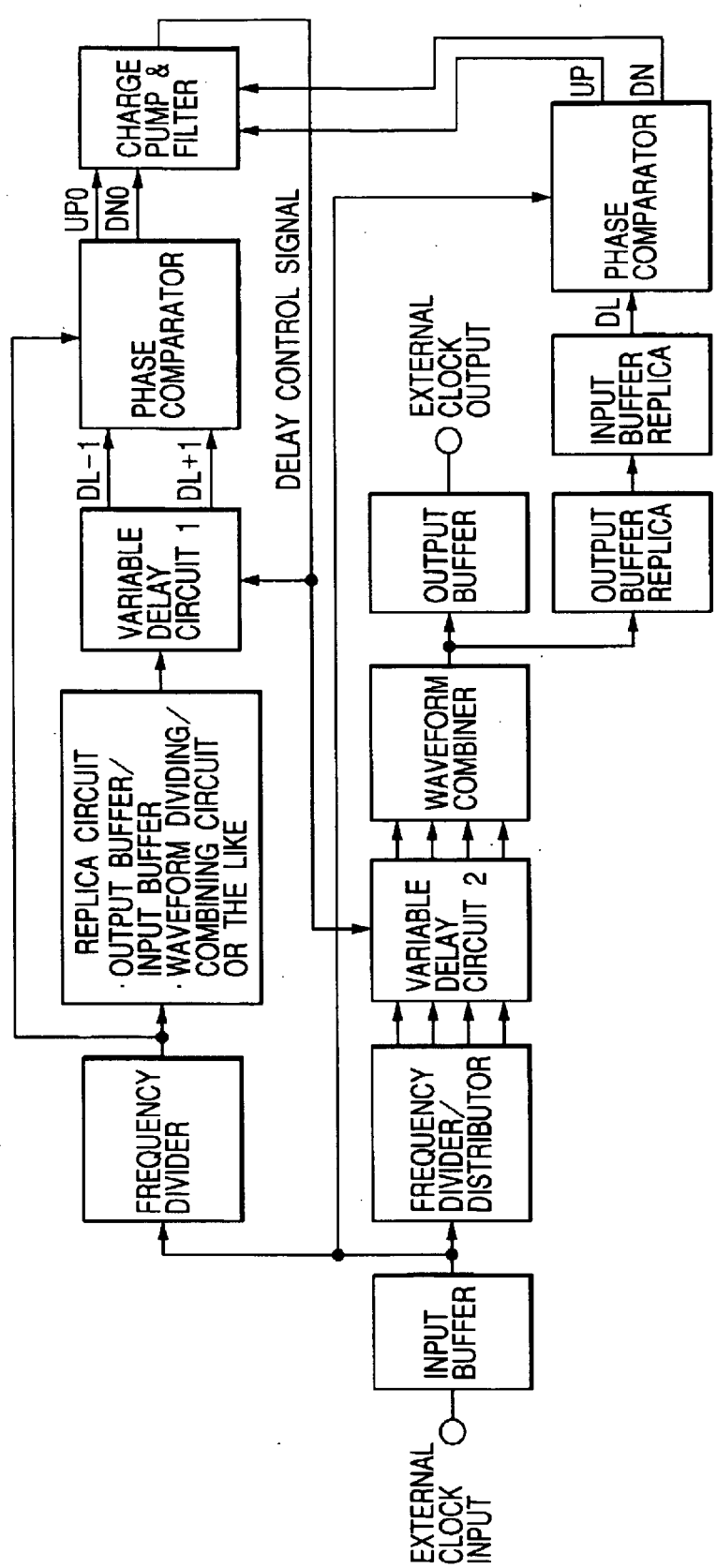
FIG. 15 is a block diagram illustrating another embodiment of the DLL circuit of the present invention.

FIG. 15 illustrates a block diagram of the other embodiment of the DLL circuit of the present invention. In this embodiment, the phase comparator for fine adjustment is located, for example, in the other area. As the signals compared by the phase comparator for fine adjustment, the output signal of input buffer is compared with an output signal of the input section for external clock output provided with the other output buffer and input buffer (replica circuit). Accordingly, the direct phase synchronization can be performed through comparison with an output of the input buffer, namely with the delay signal which is actually outputted.

In the embodiment described above, the circuit structure can be ready for longer period owing to the technology introduced to the variable delay circuit 2 of FIG. 1 and thereby can expand the operation range. Moreover, since the operation range is separated for the coarse adjustment and fine adjustment, if the phase is deviated to a large extent, quick phase matching can be realized by suppressing overswing. Because of separation of operation range for the coarse adjustment and fine adjustment, jitter can be reduced by setting the small step for fine adjustment. Therefore, if the phase against the input pulse is largely deviated from the locked condition with a certain reason, the coarse adjustment circuit automatically operates to realize quick matching of the phase. Namely, since the operation range is separated for the coarse adjustment and fine adjustment, the coarse adjustment circuit operates when phase deviation exceeds the range of fine adjustment (as many as variable delay forming unit of ±1 stage) and the phase can be matched with the fine adjustment operation when the period becomes small (less than the variable delay forming unit of ±1 stage).

Figure 16:
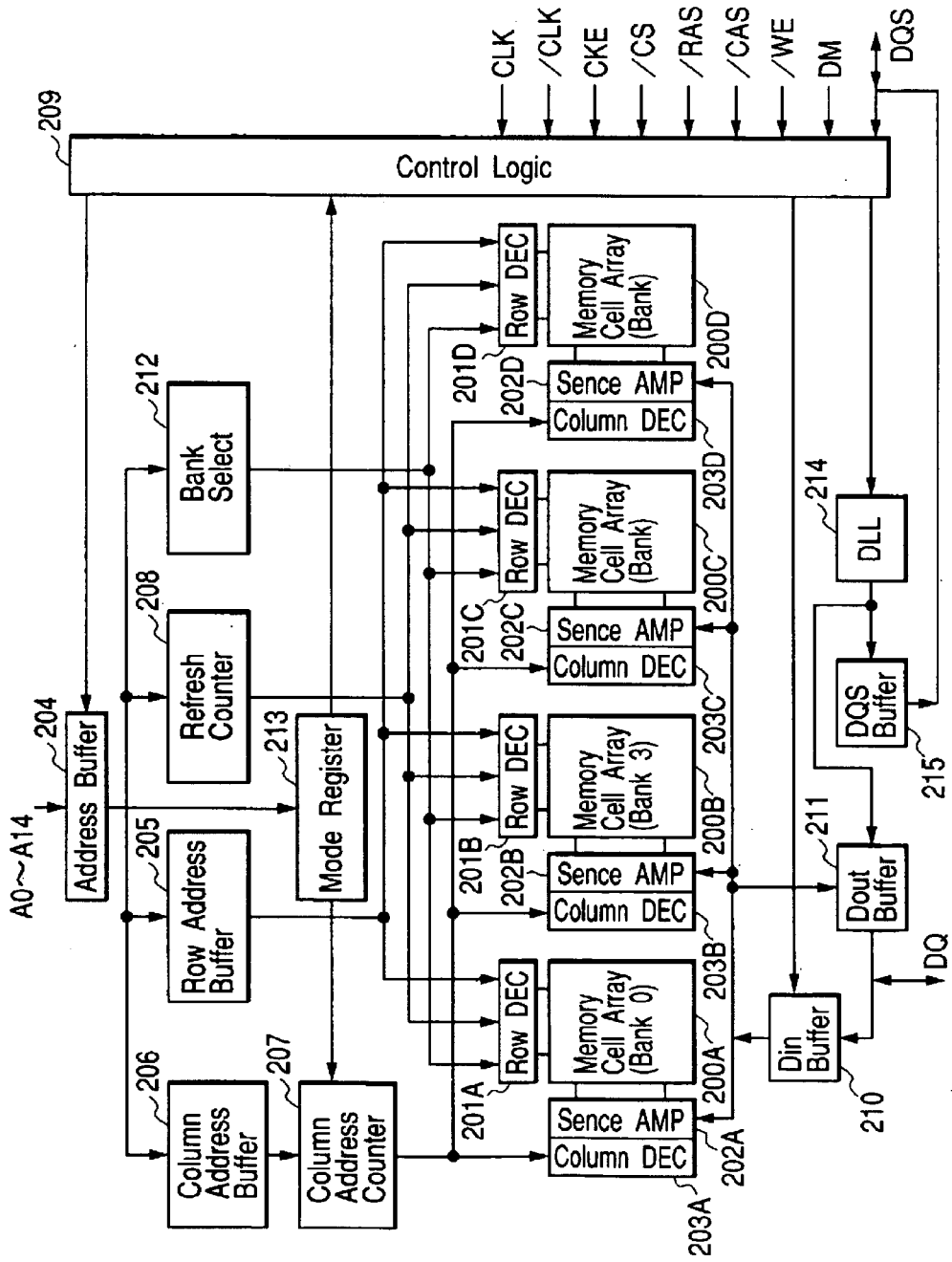
FIG. 16 is a total block diagram illustrating an embodiment of DDR, SDRAM to which the present invention is applied.

FIG. 16 illustrates a total block diagram of an embodiment of the DDRSDRAM (Double Data Rate Synchronous Dynamic Random Access Memory) to which the present invention is adapted. The DDR SDRAM of this embodiment is provided, although not particularly restricted, with four memory arrays 200A to 200D corresponding to four memory banks. The memory arrays 200A to 200D respectively corresponding to the four memory banks 0 to 3 are provided with dynamic memory cells allocated like a matrix. According to the figure, the selection terminals of the memory cells allocated in the same column are coupled with the word lines (not illustrated) of each column, while the input/output terminals of the memory cells allocated in the same row are coupled with the complementary data lines (not illustrated) of each row.

In regard to the word lines not illustrated of the memory array 200A, only one word line is driven to the selection level depending on the result of decoding of the row address signal by a row decoder (Row DEC). The complementary data lines not illustrated of the memory array 200A are coupled with the I/O lines of a sense amplifier (SenseAMP) 202A and a column selection circuit (Column DEC) 203A. The sense amplifier 202A is the amplifying circuit for detecting and amplifying a fine potential difference appearing on the complementary data lines due to the data read operation from the memory cells. The column selection circuit 203A in this amplifying circuit includes a switch circuit for individually selecting the complementary data lines and then connecting these lines to the complementary I/O lines. A column switch circuit is selectively operated depending on the result of decoding of the column address signal by the column decoder 203A.

The memory arrays 200B to 200D are also provided with row decoders 201B to 201D, sense amplifiers 202B to 202D and column selection circuits 203B to 203D. The complementary I/O lines are used in common for each memory bank and are connected to the output terminal of a data input circuit (Din Buffer) including a write buffer 210 and the input terminal of a data output circuit (Dout Buffer) 211 including a main amplifier. A terminal DQ is defined, although not particularly restricted, as the data input/output terminal for inputting or outputting the data D0 to D15 of 16 bits. A DQS buffer 215 generates a data strobe signal of the data outputted from the terminal DQ.

The address signals A0 to A14 supplied from the address input terminal are once stored in an address buffer 204. The row-system address signal among the above address signals inputted on the time series basis is stored in a row address buffer 205. The column-system address signal is stored in a column address buffer 206. A refresh counter 208 generates the row address for the automatic refresh and self refresh modes.

A mode register 213 stores each operation mode information. In regard to the row decoders 201A to 201D, only the row decoder corresponding to the bank designated with a bank select circuit 212 operates to realize selective operation of the word lines. With supply of the external control signals such as clock signals CLK, /CLK (slash (/) indicates row enable signal), clockenable signal CKE, chip select signal /CS, column address strobe signal /CAS, row address strobe signal /RAS and write enable signal /WE and the address signals via the /DM, DQS and mode register 213, a control circuit 209 generates an internal timing signal for controlling the operation mode of the DDR SDRAM, test mode and operation of the circuit blocks based on the level change and timing of the signals listed above. Moreover, this control circuit 209 is provided with the input buffers corresponding to these signals.

The clock signals CLK and /CLK are inputted to the DLL circuit 214 through the clock buffer to generate an internal clock. The internal clock is used, although not particularly restricted, as the input signal of the data output circuit 211 and DQS buffer 215. In addition, the clock signals inputted through the clock buffer are supplied to the clock terminals for application to the data input circuit 210 and column address counter 207.

The other external input signal is validated in synchronization with the rising edge of the relevant internal clock signal. The chip select signal /CS instructs start of command input cycle with its low level. When the chip select signal /CS is in the high level (chip non-selecting condition), this signal and the other signals do not have any meaning. However, the selecting condition of the memory bank and internal operation such as burst operation are never influenced by the shift to the non-selecting condition. The signals of /RAS, /CAS and /WE have the functions which are different from that of the corresponding signals in the ordinary DRAM and these area validated in order to define the command cycle described later.

The clock enable signal CKE is used to instruct validity of the next clock signal. When the relevant signal CKE is in the high level, the rising edge of the next clock signal CLK is validated but when the signal CKE is in the low level, the rising edge is invalidated. When the external control signal /OE for controlling the output enable mode to the data output circuit 211 is provided in the read mode, this signal /OE is also supplied to the control circuit 209. When the signal /OE is in the high level, for example, the data output circuit 211 is set to the high output impedance condition.

The read operation of the DDR SDRAM is executed as follows. Each signal of chip select /CS, /RAS, /CAS and write enable /WE is respectively inputted in synchronization with the clock CLK signal. The row address and bank selection signal are inputted simultaneously when the signal /RAS is set to 0 and are held with the row address buffer 205 and bank select circuit 212. The row decoder 210 designated with the bank select circuit 212 decodes the row address signal to output the data of total rows as a minute signal from the memory cell array 200. The outputted minute signal is amplified and stored with the sense amplifier 202. The bank designated becomes active.

After three clocks from input of the row address, the column address and bank selection signal are inputted simultaneously when the signal CAS is set to 0 and respective signals are held with the column address buffer 206 and bank select circuit 212. When the designated bank is active, the column address being held is outputted from the column address counter 207 and the column decoder 203 selects the column. The selected data is outputted from the sense amplifier 202. In this case, two sets of data (8 bits in the×4 bits structure, 32 bits in the×16 bits structure) are outputted.

The data outputted from the sense amplifier 202 is then outputted to the outside of chip from the data output circuit 211. The output timing is synchronized with both rising and falling edges of the clock QCLK outputted from the DLL 214. In this case, two sets of data is converted to the serial data from the parallel data as described above and becomes the data of the structure (one set of data×2). The data strobe signal DQS is outputted from the DQS buffer 215 simultaneously with data output. When the burst length stored in the mode register 213 is 4 or longer, the column address counter 207 is automatically incremented to read the next column data.

The DLL 214 has a roll of generating the operation clock QCLK of the data output circuit 211 and DQS buffer 215. Both data output circuit 211 and DQS buffer 215 take a certain period of time until the data signal and data strobe signal are actually outputted from the input of the internal clock signal QCLK generated by the DLL 214. Therefore, the phases of the data signal and data strobe signal are matched with the external clock CLK by giving a lead to the phase of the internal clock signal QCLK against the external CLK using the replica circuit. Accordingly, the data signal and data strobe signal can be matched in the phase with the external clock signal.

In this embodiment, the DDR SDRAM which can assure the higher response characteristic and the high speed operation can be achieved because of use of the DLL circuit, which can be operated in the wider operation frequency within the short synchronization time and can also obtain the synchronization signal stabilized for the frequency up to higher frequency band.

Figure 17:
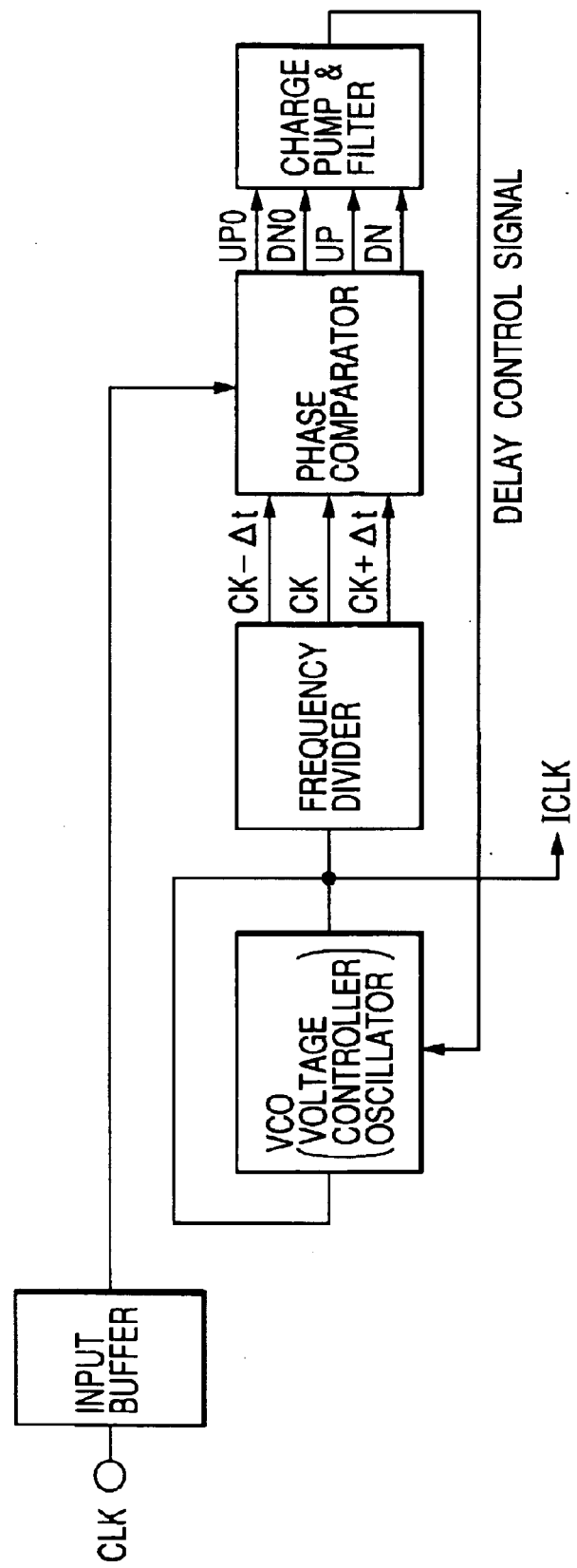
FIG. 17 is a block diagram illustrating an embodiment of the PLL circuit utilizing the synchronization circuit of the present invention.

FIG. 17 is a block diagram illustrating an embodiment of the PLL circuit utilizing the synchronization circuit of the present invention. A ring oscillator is formed by using the odd number of stages of the variable delay circuit and then feeding back an output signal of such variable delay circuit to the input thereof and this ring oscillator is used as a voltage controlled oscillation circuit VC0. An output signal of this VC0 is divided in the frequency by a frequency dividing circuit to form the frequency-divided output CK and the signals CK−Δt and CK+Δt which are different from the signal CK only in the phase of Δt. These frequency divided signals are then supplied to the phase comparator described in FIG. 6 for the phase comparison with the clock signal CLK supplied from the external circuit. Thereby, the signals UP0/DN0 for coarse adjustment and the signals UP/DN for fine adjustment are formed. These signals are then supplied to the charge pump & filter to form the delay control signal which is used to control the variable delay stages forming the VC0 described above.

For example, the signals CK−Δt, CK and CK+Δt give the delay as much as Δt to the frequency-divided output CK' through a couple of delay circuits. Accordingly, it is enough when the CK' is used as CK−Δt, CK'+Δt as CK and CK'+2Δt as CK+Δt. Otherwise, the pulse formed during the frequency dividing process in the frequency divider may also be used. Namely, it is also possible to use three signals which are deviated in the phase in every half-period from the input pulse illustrated in FIG. 14 by utilizing the frequency divider/distributor illustrated in FIG. 13.

Owing to the structure described above, the VC0 can generate the internal clock signal ICLK which is synchronized with the external clock CLK and is multiplied corresponding to the frequency dividing ratio in the frequency divider. When the VC0 generates the internal pulse of the equal frequency to the external clock CLK, the frequency divider described above may be eliminated. In this case, as the signals CK−Δt and the CK+Δt, the signals of the one preceding stage and one subsequent stage of the unit delay stage forming the signal CK can be used.

Under the condition that the variable delay circuit 1 forms a control signal to be synchronized with the external clock as in the case of FIG. 1 and this control signal is used as the control signal of the variable delay circuit forming the VC0, the internal clock of the frequency two times the external clock can be formed by equally setting the delay time of the unit delay stages and then reducing the number of stages of the variable delay stages of the VC0 to the (½)-stage of the variable delay circuit 1 and the internal clock signal of the frequency for times the external clock can be formed by reducing the number of stages to (¼)-stage of the variable delay stages.

The present invention has been described practically on the basis of the preferred embodiment thereof but the present invention is never restricted only to the embodiment described above and allows, of course, various changes and modifications without departure from the claims thereof. For example, various embodiments can be introduced for the phase comparator, the circuit to form the delay signals DL−1 and DL+1 for specifying the coarse adjustment range and minute range to the standard delay signal DL and the circuit to realize phase comparison with such delay signals. The DLL circuit described above can also be adapted to the synchronous SRAM and various semiconductor integrated circuit devices to form the signal synchronized with the clock supplied from the external circuit, in addition to the DDR SDRAM described above. As described, the present invention may be widely used as the synchronization circuit and synchronization method.

The typical inventions of the present invention can provide the following effects. Both response characteristic and stability can be attained, through the simplified structure, by generating a first pulse to be synchronized with the reference pulse, a second pulse which is leading in the phase for a certain period to the first pulse and a third pulse which is delayed in the phase by a certain period from the first pulse with a first variable delay circuit, comparing the reference pulse with the first pulse by a first phase comparing circuit, comparing the reference pulse with the second pulse and third pulse by a second phase comparing circuit, forming a control voltage by a control voltage generating circuit which receives the comparison output of the first phase comparing circuit and the comparison output of the second phase comparing circuit by giving priority to the comparison output of the second comparing circuit against the comparison output of the first phase comparing circuit, and controlling the delay time of the first variable delay circuit by forming the control voltage by the comparison output of the first phase comparing circuit after the phases of the reference pulse and the second pulse or third pulse are matched by the second phase comparing circuit.

Moreover, the signal synchronized up to higher frequency with higher accuracy can be obtained by dividing the frequency of the reference pulse by the frequency dividing circuit, forming the first pulse to be synchronized with this frequency-divided pulse in the first variable delay circuit, comparing the frequency-divided pulse with the first pulse by the first phase comparing circuit, dividing the frequency of the reference pulse in the equal diving ratio of the above-mentioned frequency-dividing circuit, forming multiphase clocks corresponding to such frequency dividing ratio by the frequency dividing/distributing circuit, giving delay to the multiphase clocks by the second variable delay circuit formed of the frequency dividing/distributing circuit in the identical structure to the first variable delay circuit, forming the control voltage of the first and second variable delay circuits by the control voltage generating circuit which receives the comparison output of the first phase comparing circuit, and generating the pulse corresponding to the reference pulse by referring a plurality of delay outputs of the second variable delay circuit to the waveform shaping circuit.

What is claimed is:

1. A synchronization circuit, comprising:
a reference pulse;
a first variable delay circuit for generating a first pulse to be synchronized with said reference pulse, a second pulse which is leading in phase for a certain period relative to said first pulse, and a third pulse which is delayed in phase for a certain period from said first pulse;
a first phase comparing circuit for comparing said reference pulse with said first pulse;
a second phase comparing circuit for comparing said reference pulse and said second pulse and said third pulse; and
a control voltage generating circuit for generating a control voltage for controlling said first variable delay circuit in response to a comparison output of said first phase comparing circuit and a comparison output of said second phase comparing circuit;
wherein said control voltage generating circuit generates said control voltage by giving priority to the comparison output of said second phase comparing circuit with respect to the comparison output of said first phase comparing circuit, and also generates, after said reference pulse and said second pulse or third pulse are matched in phase at said second phase comparing circuit, said control voltage by the comparison output of said first phase comparing circuit.

2. The synchronization circuit according to claim 1,
wherein said variable delay circuit comprises a plurality of stages of a unit variable delay circuit,
wherein said second pulse is an input pulse of said unit delay circuit to form said first pulse, and
wherein said third pulse is an output pulse of said unit delay circuit to receive said first pulse.

3. The synchronization circuit according to claim 2,
wherein said synchronization circuit is mounted over a semiconductor integrated circuit device,
wherein said synchronization circuit comprises a second variable delay circuit including a plurality of unit delay circuits for forming said first pulse of said first variable delay circuit and being controlled in the delay time thereof by said control voltage,
wherein said reference pulse is inputted from the external terminal of said semiconductor integrated circuit device and then inputted to said first and second variable delay circuits, and
wherein a pulse synchronized with said reference pulse is outputted from said second variable delay circuit.

4. The synchronization circuit according to claim 3,
wherein said reference pulse is inputted to said first and second variable delay circuits via an input buffer,
wherein an output pulse generated by said second variable delay circuit is outputted from the external terminal via an output buffer, and
wherein a replica circuit having a delay time equivalent to that of said input buffer and said output buffer is provided between said input buffer and said first variable delay circuit.

5. The synchronization circuit according to claim 4, further comprising;
a frequency dividing circuit for dividing the frequency of said reference pulse;
a frequency dividing/distributing circuit for dividing the frequency of said reference pulse in a frequency dividing ratio which is equivalent to that of said frequency dividing circuit to distribute them to multiphase clocks corresponding to said frequency dividing ratio;
a second variable delay circuit comprising a plurality of stages for respectively delaying the multiphase clocks of said frequency dividing/distributing circuit; and
a waveform combining circuit for generating a pulse corresponding to said reference pulse in response to receipt of a delayed output of said variable delay circuit.

6. A synchronization circuit, comprising:
a reference pulse signal;
a frequency dividing circuit for dividing the frequency of said reference pulse signal;
a first variable delay circuit for generating a first pulse signal to be synchronized with the frequency-divided pulse signal of said frequency dividing circuit;
a first phase comparing circuit for comparing said frequency-divided pulse signal with said first pulse signal;
a frequency dividing/distributing circuit for dividing the frequency of said reference pulse signal and for generating multiphase clocks corresponding to the frequency dividing ratio;
a second variable delay circuit which is configured to have an identical structure to that of said first variable delay circuit and comprises a plurality of stages for respectively delaying the multiphase clocks formed in said frequency dividing/distributing circuit;
a waveform combining circuit for generating a pulse signal corresponding to said reference pulse signal in response to receipt of a delayed output from a plurality of stages of said second variable delay circuit; and
a control voltage generating circuit for generating control voltages for control of said variable delay circuit and said second variable delay circuit in response to receipt of a comparison output of said first phase comparing circuit.

7. The synchronization circuit according to claim 6,
wherein said synchronization circuit is mounted over a semiconductor integrated circuit device,
wherein said reference pulse is inputted from the external terminal of said semiconductor integrated circuit device and is then inputted to said first and said second variable delay circuits.

8. A synchronization method comprising the steps of:
forming a first pulse to be synchronized with a reference pulse by a first variable delay circuit, a second pulse which is leading in phase for a certain period relative to said first pulse and a third pulse which is delayed in phase for a certain period from said first pulse;
comparing said reference pulse with said first pulse by a first phase comparing circuit;
comparing said reference pulse with said second pulse and said third pulse by a second phase comparing circuit; and
forming a control voltage with a control voltage generating circuit by giving priority to a comparison output of said second phase comparing circuit with respect to a comparison output of said first phase comparing circuit, matching the phase of said reference pulse with the phase of said second pulse or said third pulse, and then matching, after said matching of phases, the phase of said reference pulse with the phase of said first pulse by forming said control voltage from the comparison output of said first phase comparing circuit.

9. A synchronization method comprising the steps of:

dividing the frequency of a reference pulse signal by use of a frequency dividing circuit;

forming a first pulse signal to be synchronized with the frequency-divided pulse signal of said frequency dividing circuit by use of a first variable delay circuit;

comparing said frequency-divided pulse signal with said first pulse signal by use of a first phase comparing circuit;

dividing the frequency of said reference pulse and forming multiphase clocks corresponding to the frequency dividing ratio by use of a frequency dividing/distributing circuit;

delaying, respectively, multiphase clocks generated by said frequency dividing/distributing circuit with a plurality of stages of a second variable delay circuit configured to have the same structure as that of said first variable delay circuit;

generating, by use of a waveform combining circuit, a pulse signal corresponding to said reference pulse signal from a delayed output of said second variable delay circuit; and forming, by use of a control voltage generating circuit, a control voltage for control of said first and second variable delay circuits corresponding to a comparison output of said first phase comparing circuit.

* * * * *